United States Patent [19]
Lee

[11] Patent Number: 5,639,203
[45] Date of Patent: Jun. 17, 1997

[54] SEMICONDUCTOR DEVICE TRANSFER APPARATUS

[75] Inventor: Duk Hee Lee, Kyungsangbuk-do, Rep. of Korea

[73] Assignee: LG Semicon Co., Ltd., Chungcheongbuk-do, Rep. of Korea

[21] Appl. No.: 455,858

[22] Filed: May 31, 1995

[30] Foreign Application Priority Data

Jun. 3, 1994 [KR] Rep. of Korea ............... 12881/1994

[51] Int. Cl.$^6$ ............................................. B65G 49/05
[52] U.S. Cl. ........................................ 414/416; 414/750
[58] Field of Search ............................ 414/404, 416, 414/417, 750, 799, 938; 294/65, 87.1

[56] References Cited

U.S. PATENT DOCUMENTS

| | | | |
|---|---|---|---|
| 4,449,885 | 5/1984 | Hertel et al. | 414/750 |
| 4,586,247 | 5/1986 | Murai et al. | 414/750 X |
| 4,957,406 | 9/1990 | Akagawa | 414/938 X |
| 5,007,788 | 4/1991 | Asano et al. | 294/87.1 X |
| 5,188,499 | 2/1993 | Tarng et al. | 414/416 X |
| 5,290,134 | 3/1994 | Baba | 414/416 X |

FOREIGN PATENT DOCUMENTS

| | | | |
|---|---|---|---|
| 1048442 | 2/1989 | Japan | 414/938 |
| 1-255242 | 10/1989 | Japan | 414/938 |
| 0215615 | 8/1990 | Japan | 414/750 |
| 3-273662 | 12/1991 | Japan | 414/938 |

*Primary Examiner*—James W. Keenan

[57] ABSTRACT

A semiconductor device transfer apparatus which can transfer semiconductor devices from a tray to a board in a short time period with spacings between the semiconductor devices adjusted as required at the board, is disclosed. The transfer device includes a tray having more than one semiconductor devices arranged thereon, a first pick-up for picking up a plurality of semiconductor devices from the tray at the same time and placing the semiconductor devices on setting blocks, a semiconductor device spacing adjustment mechanism provided at one side of the tray for adjusting spacings between the semiconductor devices on the setting blocks as required at the board, and a second pick-up for transferring the space-adjusted semiconductor devices onto the board.

18 Claims, 5 Drawing Sheets

SEMICONDUCTOR DEVICE TRANSFER APPARATUS

BACKGROUND OF THE INVENTION

1. Field of the Invention

This invention relates to a semiconductor device transfer apparatus, and more particularly to a semiconductor device transfer apparatus which can transfer semiconductor devices from a tray to a board in a short time period with spacings between the semiconductor devices already adjusted to fit on the board.

2. Description of the Prior Art

FIG. 1 is a plan view of a conventional semiconductor device transfer apparatus. As shown in FIG. 1, a pick-up 5 is mounted on an X-Y robot 4 movable in a vertical direction. The pick-up 5 transfers one semiconductor device at a time 2 from a tray 1 to a board 3 with the spacings between the semiconductor devices adjusted.

That is, in order to transfer semiconductor devices 2 from the tray 1 to the board 3, the X-Y robot 4 moves the pick-up 5 attached thereto towards one of the semiconductor devices in the tray. Then, with a cylinder (not shown) operated, the pick-up 5 is lowered to make contact with one of the semiconductor devices. When a vacuum is actuated during the pick-up process, the semiconductor device on the tray 1 is drawn in and attached to the pick-up 5.

When the selected semiconductor device 2 is attached to the pickup 5, the pick-up 5 rises again. At the same time, the X-Y robot 4 moves the pick-up 5 to a position over a spot on the board 3 where the semiconductor device is to be placed. Under this condition, the cylinder is actuated to lower the pick-up 5 having the selected semiconductor device 2 attached thereto, and thereby one semiconductor device is placed on the board.

The above operation is carried out repeatedly until all of the semiconductor devices are placed on the board.

Since such a conventional semiconductor device transfer apparatus can only transfer the semiconductor devices to the board one semiconductor device at a time, there has been a delay in production, which causes a problem of low productivity.

SUMMARY OF THE INVENTION

The object of this invention devised for solving the foregoing problems lies in transferring many semiconductor devices to the board at the same time, with the spacings between the semiconductor devices in the tray adjusted in advance to fit on the board.

These and other objects and features of this invention can be achieved by providing a semiconductor device transfer apparatus, including a tray having more than one semiconductor devices arranged thereon, a first pick-up for picking up the semiconductor devices from the tray at the same time, semiconductor device spacing adjustment means provided in one side of the tray for adjusting spacings of the semiconductor device transferred by the first pick-up identical to the semiconductor device spacings required at a board, and a second pick-up for transferring and placing the space adjusted semiconductor devices to and on the board at the same time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are limitative of the present invention, and wherein:

FIGS. 4a and 4b each show a plan view and a front sectional view of a semiconductor device spacing adjustment apparatus in accordance with the embodiments of this invention, wherein FIGS. 4a-1 and 4a-2 show a condition before the semiconductor devices are placed on setting blocks, and FIGS. 4b-1 and 4b-2 show a condition after the semiconductor devices are placed on the setting blocks, FIGS. 5a-1 and 5a-2 show a condition before the semiconductor devices are placed on the setting blocks, with a rack and a pinion, in accordance with the embodiments of this invention; and FIGS. 5b-1 and 5b-2 show a condition after the semiconductor devices are placed on the setting blocks, with the rack and pinion in accordance with embodiments of the present invention.

DETAILED DESCRIPTION OF THE PREFERRED EMBODIMENT

The embodiments of this invention are to be explained in detail hereinafter, referring to the attached drawings.

Figure 1:
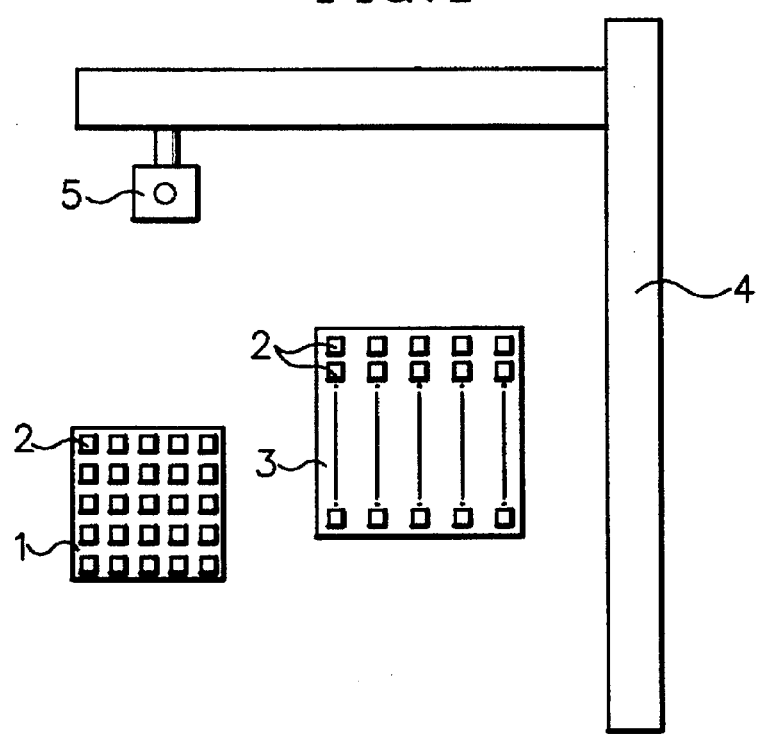
FIG. 1 is a plan view of a conventional semiconductor device transfer apparatus.
Figure 2:
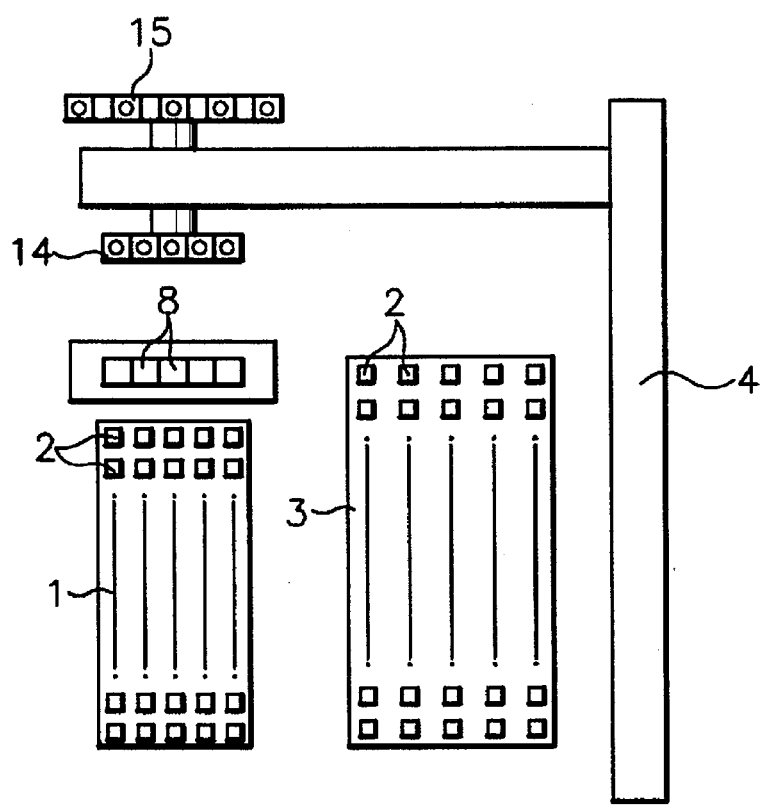
FIG. 2 is a plan view of a semiconductor device transfer apparatus in accordance with this invention.
Figure 3:
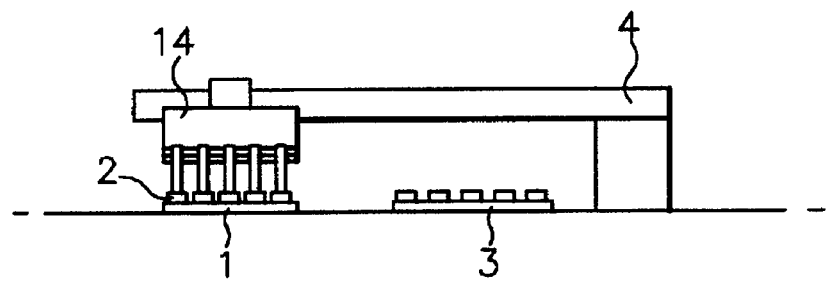
FIG. 3 is a front view of FIG. 2.

FIG. 2 is a plan view of a semiconductor device transfer apparatus in accordance with this invention, FIG. 3 is front view of FIG. 2, and FIGS. 4a-1, 4a-2, 4b-1 and 4b-2 show a plan view and a front sectional view of a semiconductor device spacing adjustment apparatus according to the embodiments of this invention. As can be seen from the drawings, the present invention a semiconductor transfer apparatus having a semiconductor device spacing adjustment apparatus. The semiconductor device spacing adjustment, apparatus is provided at one side of a tray 1 having a plurality of semiconductor devices 2 arranged thereon for pre-adjusting spacings between the plurality of semiconductor devices as required in a board 3.

One embodiment of the semiconductor device spacing adjustment apparatus is shown in FIGS. 4a-1, 4a-2, 4b-1 and 4b-2. As shown, a plurality of setting blocks 8, supported by placing plates 6, are in close contact to one another by the spring forces of elastic members 7 at the initial stage before the semiconductor devices are placed on the setting blocks. When the semiconductor devices are put on the setting blocks, a setting block spacing adjustment mechanism moves the setting blocks into different positions so that there between are identical to the spacings in the board 3.

It is desirable to place the semiconductor device spacing adjustment apparatus on a same plan with the tray 1 in a horizontal direction. This is for keeping an operation range of the X-Y robot 4 to the minimum, which reduces the time period required for adjusting semiconductor device spacing, and consequently improves productivity.

Although it is desirable that a coil spring is used as each of the elastic members 7 that forces each of the setting blocks 8 to be in close contact with one another at an initial stage, any member similar to the coil spring that can force each of the setting blocks 8 to be in close contact with one another at the initial stage can also be used.

A guide part is provided for stable movements of the setting block 8 when the setting block spacing adjustment mechanism carries out a spacing adjustment of the setting blocks 8.

The setting block spacing adjustment mechanism moves the setting blocks 8 with the semiconductor devices therein to predetermined positions, so that the spacings between the semiconductor devices correspond with the spacings required for the board 3. The setting block spacing adjustment mechanism includes projection pieces 9 and a moving block 10. That is, while one of the setting blocks 8 is fixed to an end of the placing plate 6, the other setting blocks 8 have projection pieces 9 each attached to the underside of each of the setting blocks with the length of the projection pieces increasing gradually. And, the moving block 10 having steps 10a, each of which makes contact with one of the projection pieces, is provided on one side of the projection pieces.

Although the moving block 10 is provided to make reciprocating movement with a cylinder 11, the moving block 10 may be provided to make the reciprocating movements with a rack engaged to a pinion which is rotated by a step motor, as shown in FIGS. 5a-1, 5a-2, 5b-1 and 5b-2, or with other operating mechanism.

A system of the guide part that guides the setting blocks 8 in moving to spacing positions identical to the semiconductor device spacings in the board 3 is as follows. The guide part includes each of coupling pieces 12 fixed to each side of each of the setting blocks 8 wherein each end thereof is connected to a coil spring, and two guide bars 13 provided on both sides of the setting blocks 8. Both ends of the guide bars 13 are fixed to the placing plates 6 and are for inserting through the coupling pieces 12.

In this time, a bearing may be provided at a part of the coupling piece 12 where the guide bar 13 is inserted through, to make the bearing in contact with the guide bar for more stable movement of the setting block.

The number of setting blocks 8 on which the semiconductor devices are placed is provided identical to the number of semiconductor devices to be placed on the setting blocks at the same time, and the configuration of the each of setting blocks includes a surface mounting type for mounting a surface mounting type semiconductor device.

The X-Y robot 4 includes, at one end thereof, a first pick-up 14 for transferring the semiconductor devices at the same time from the tray 1 to each of the setting blocks 8 which are in close contact with one another, and a second pick-up 15 provided at a side opposite to the first pick-up 14 for drawing in the semiconductor devices having the spacings adjusted by the semiconductor device spacing adjustment from the setting blocks 8 and transferring them to the board 3, at the same time.

Operation and advantages of this invention are to be explained hereinafter.

Figures 1, 4A:
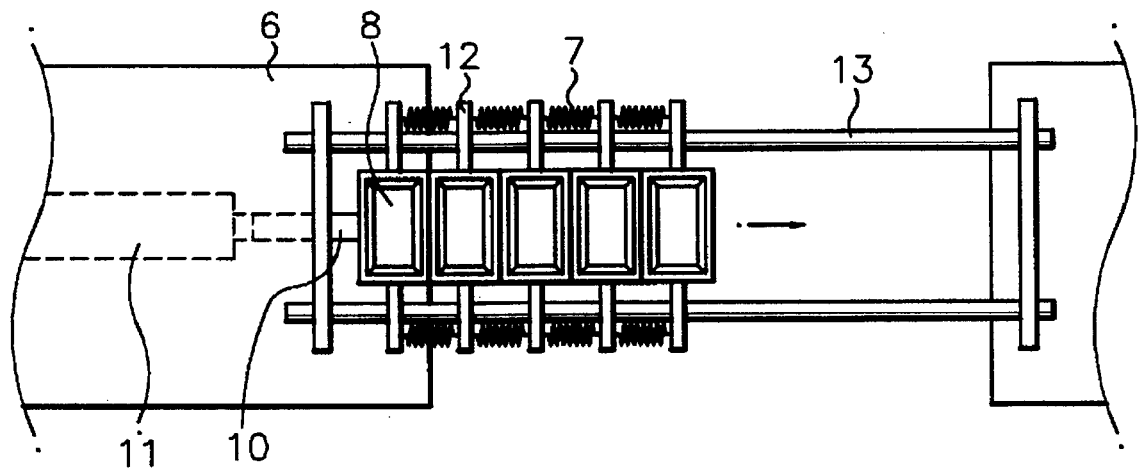
Figures 2, 4A:
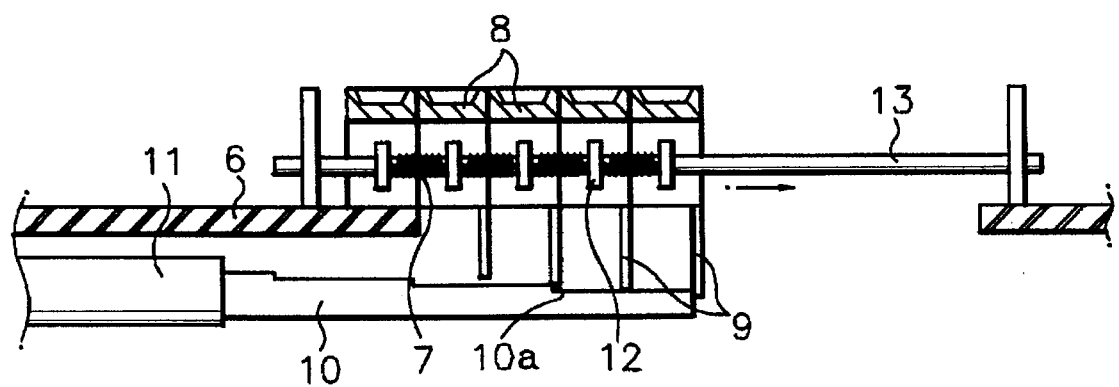

As shown in FIG. 4a-1 and 4a-2, the setting blocks are in close contact with one another due to the forces of the elastic members 7, before the semiconductor devices 2 are transferred from the tray 1 to the setting blocks 8 of the semiconductor device spacing adjustment apparatus.

Under this condition, by operating the X-Y robot 4, the first pick-up 14 is moved to, and stopped at a position just over the semiconductor devices on the tray 1, and by operating a cylinder for the first pick-up 14, the first pick-up 14 makes contact with the semiconductor devices and draws in a plurality of semiconductor devices 5 (FIG. 2) at once.

Then, after restoring the first pick-up 14 into the initial position by operating the cylinder, by operating the X-Y robot 4 all of the drawn in semiconductor devices are moved just over the setting blocks 8 when the X-Y robot 4 is stopped. By operating the first pick-up cylinder, these drawn-in semiconductor devices are positioned within the setting blocks, when the vacuum is released.

Thus, the plurality of semiconductor devices are placed on the setting blocks 8 at the same time.

In this time, since the cylinder 11 for moving the moving block 10 is not operated to exert force on the setting blocks, the setting blocks 8 remain in close contact with one another by the force of the elastic members 7.

After transferring the plurality of semiconductor devices 2 from the tray 1 to the setting blocks 8, the pick-up part of the X-Y robot is moved forward out of the working area.

Figures 1, 4B:
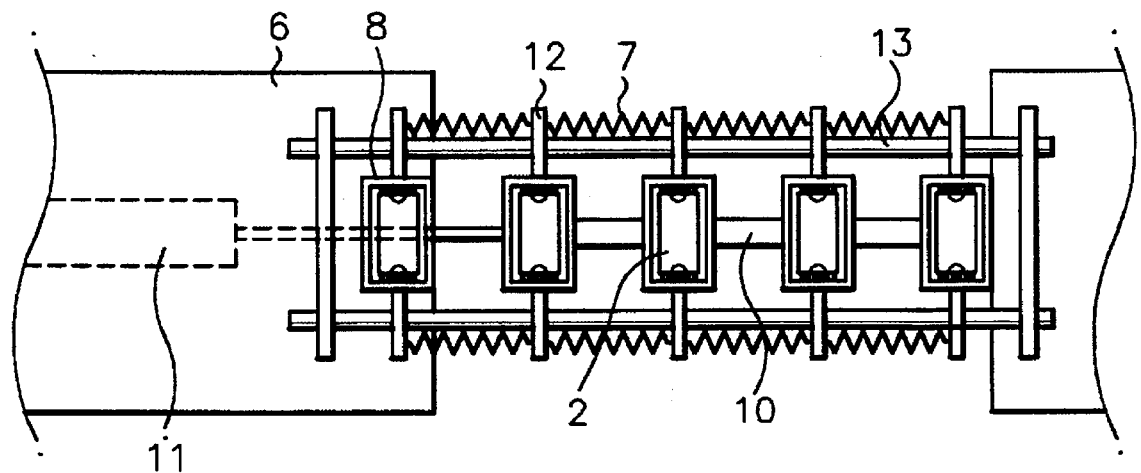
Figures 2, 4B:
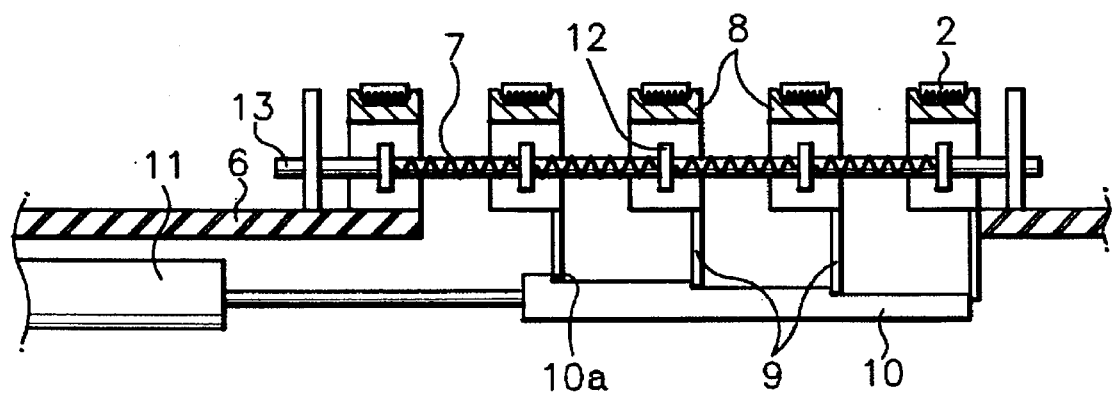
Figures 1, 5A:
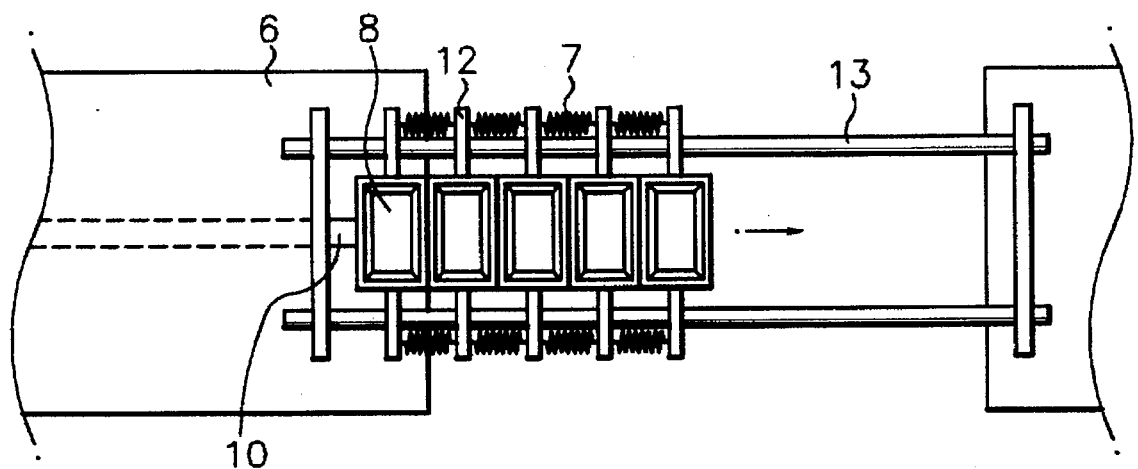
Figures 2, 5A:
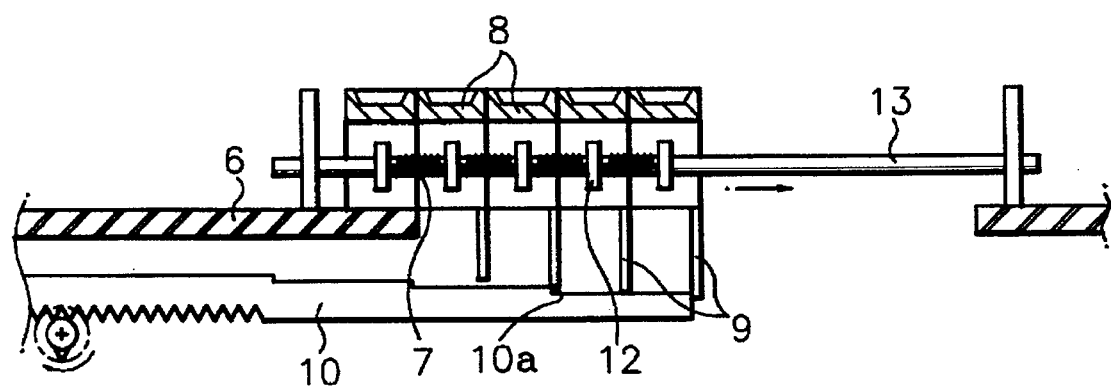
Figures 1, 5B:
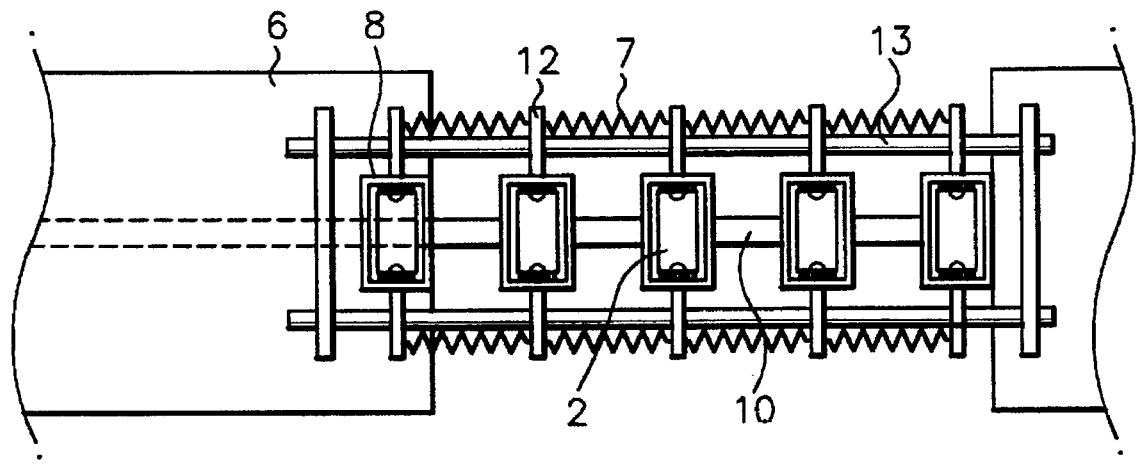
Figures 2, 5B:
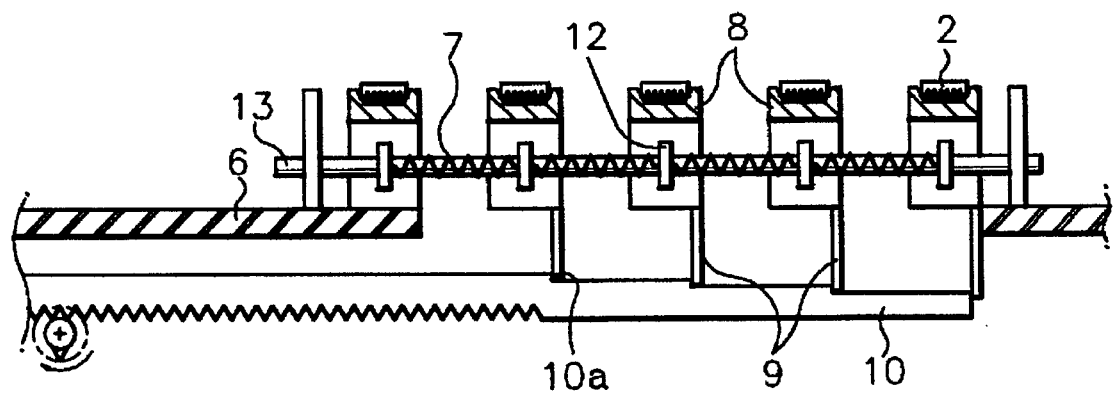

Then, in order to make the spacings of the setting blocks 8 identical to the semiconductor device spacings required at the board 3, the cylinder 11 for the moving block 10 is operated, with which the steps 10a at the moving block 10 are moved forward, causing each of the steps 10 to make contact with one of the projection pieces 9 fixed to the underside of each of the setting blocks 8 and causing, on further movement of the steps, the setting blocks 8 to move forward along the movement of the steps as shown in FIGS. 4b-1 and 4b-2. As a result spacings of the setting blocks 8 can be adjusted.

According to this operation, spacings of the semiconductor devices 2 on the setting blocks 8 can be adjusted to be the same as the semiconductor device spacings required at the board 3. At this time, since the coupling pieces 12 at both sides of the setting blocks 8 are moved along the guide bars 13, movement of the setting blocks is stable.

When the spacings of the semiconductor devices 2 on the setting blocks 8 are adjusted to be identical to the semiconductor device spacings required at the board 3, the X-Y robot 4 is operated again to move the second pick-up 15 just over the setting blocks where the spacing setting operation has stopped. Then, by operating the cylinder of the second pick-up 15, the second pick-up 15 is lowered to make contact with the semiconductor devices, when a vacuum is actuated at the second pick-up 15 to draw in the semiconductor devices from the setting blocks 8, after which, by restoring the cylinder of the second pick-up 15 to the initial position, picking-up of the semiconductor devices is finished.

Under this condition, by operating the X-Y robot 4 again, the semiconductor devices picked-up by the second pick-up 15 are moved to just over a predetermined spot on the board 3 on which the semiconductor devices are to be placed. As the X-Y robot is stopped and the second pick-up 15 is lowered by the cylinder, the plurality of semiconductor devices having the spacings adjusted to fit on the board be placed at the board at the same time.

During the foregoing operation, since the cylinder 11 that moves the moving block 10 is restored into its initial position, the contacts between the steps 10a of the moving block 10 and the projection pieces 9 are released and the setting blocks 8 are moved back to their initial positions, making close contact with one another.

According to the embodiments of the present invention, the semiconductor devices in the tray 1 can be, transferred to the setting blocks where their spacings are adjusted, and can be placed on the board 3, at least one row at a time.

What has been explained up to now is one cycle of operation in which one row of semiconductor devices in the tray 1 are, transferred to the setting blocks, adjusted to set the spacings therein to correspond to the spacings required at the board 3, and picked-up again and placed on the board 3. This is carried out repeatedly by the rows until of the semiconductor devices are transferred to the board.

As has been explained, since a plurality of semiconductor devices can be adjusted to set their spacings as required for the board and since the prepositioned semiconductor devices are transferred together and placed on the board at the same time, the semiconductor device transfer apparatus of this invention is advantageous because the working time period can be shortend and productivity can increase.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A semiconductor device transfer apparatus comprising:
   a first pick-up for transferring a plurality of semiconductor devices from a tray to semiconductor device spacing adjustment means;
   the semiconductor device spacing adjustment means for adjusting spacings between the plurality of semiconductor devices transferred by the first pick-up; and
   a second pick-up for placing the spacing-adjusted semiconductor devices on a board;
   wherein the semiconductor device spacing adjustment means includes,
   a plurality of setting blocks initially placed adjacent to each other for receiving the plurality of semiconductor devices from the first pick-up, one of the plurality of setting blocks being fixedly positioned, others of the plurality of setting blocks being movable, each of the movable setting blocks having a projection with a fixed length such that the projections of the movable setting blocks are arranged in the order of increasing length from the fixedly positioned setting block, and
   a moving block for making reciprocating movements, the moving block having a plurality of steps for selectively making contact with the projections of the movable setting blocks and thus moving the movable setting blocks, so as to adjust the spacings between the plurality of semiconductor devices.

2. The device as claimed in claim 1, wherein
   the plurality of setting blocks are supported by placing plates and placed in close contact with one another through a force of elastic members before receiving the plurality of semiconductor devices thereon, and
   said spacing adjustment means includes guide means for stably moving the movable setting blocks to adjust the spacings between the semiconductor devices.

3. The device as claimed in claim 2, wherein the plurality of setting blocks are placed on the same horizontal plan as the tray, and the one of the plurality of setting blocks is fixed to an end portion of one of the placing plates.

4. The device as claimed in claim 2, wherein the guide means includes:
   coupling pieces each fixed to each side of each of the setting blocks, and
   a plurality of guide bars provided on both sides of the setting blocks for inserting through the coupling pieces, both ends of each of the guide bars being fixed to the placing plates.

5. The device as claimed in claim 4, wherein each of the coupling piece includes a bearing for inserting one of the guide bars therethrough.

6. The device as claimed in claim 4, wherein the elastic members are fixed to the coupling pieces on outer side of the guide bars, each of the elastic members being a spring.

7. The device as claimed in claim 2, wherein each of the setting blocks is configured to receive a surface mounting type device thereon.

8. The device as claimed in claim 1, wherein the semiconductor device spacing adjustment means is placed on the same horizontal plan as the tray.

9. The device as claimed in claim 1, wherein the moving block is moved by a cylinder.

10. The device as claimed in claim 1, wherein the moving block includes a rack formed thereon which is engaged to a pinion rotated by a step motor.

11. The device as claimed in claim 1, wherein a number of the setting blocks on which the semiconductor devices are placed is identical to a number of the semiconductor devices placed in a row of the board.

12. An apparatus for transferring a plurality of semiconductor devices from a first station to a second station, the apparatus comprising:
    transfer means for moving a plurality of semiconductor devices from a first station to a spacing adjustment station; and
    the spacing adjustment station including a plurality of holders initially placed adjacent to each other for holding the plurality of semiconductor devices from the first station, one of the holders being fixedly positioned in the spacing adjustment station, others of the holders being movable, each of the movable holders having a projection with a fixed length such that the projections of the movable holders are arranged in the order of increasing length from the fixedly positioned holder, and moving means having a predetermined configuration for gradually interacting with each of the projections of the movable holders or gradually releasing each of the projections so as to adjust spacings between the plurality of semiconductor devices held by the holders,
    wherein the transfer means transfers the spacing-adjusted semiconductor devices to a second station.

13. An apparatus of claim 12, wherein the spacing adjustment station further includes:
    a plurality of coupling pieces each fixed to first and second sides of each of the holders;
    a plurality of elastic members each fixed between the plurality of coupling pieces; and
    a plurality of guide bars movably connecting with the plurality of coupling pieces.

14. An apparatus of claim 12, wherein the predetermined configuration includes a plurality of steps.

15. An apparatus of claim 12, wherein the transfer means includes an X-Y robot movable in a horizontal or vertical direction.

16. A method of transferring a plurality of semiconductor devices from a first station to a second station, the method comprising the steps of:
    moving a plurality of semiconductor devices from a first station to a spacing adjustment station;

holding the plurality of semiconductor devices moved from the first station in a plurality of holders arranged in line;

fixing one of the plurality of holders in the spacing adjustment station as a fixed holder;

providing others of the plurality of holders as movable holders and providing each of the movable holders with a projection having a fixed length such that the projections of the movable holders are arranged in the order of increasing length from the fixed holder;

moving a moving block having a predetermined configuration so that each of the projections of the movable holders gradually interacts with the moving block so as to move the moving blocks, and thereby adjusting spacings between the plurality of semiconductor devices; and transferring the spacing-adjusted semiconductor devices to a second station.

17. A method of claim 16, wherein each of said moving step and said transferring step includes the step of:

lifting the plurality of semiconductor devices using a vacuum.

18. A method of claim 16, further comprising the steps of:

providing a plurality of coupling pieces each fixed to first and second sides of each of the holders;

providing a plurality of elastic members each fixed between the plurality of coupling pieces; and providing a plurality of guide bars movably connected with the plurality of coupling pieces so that the plurality of holders can be smoothly moved.

* * * * *